United States Patent
Choi et al.

(10) Patent No.: US 8,258,843 B2
(45) Date of Patent: Sep. 4, 2012

(54) SEMICONDUCTOR DEVICE AND METHOD FOR OPERATING THE SAME

(75) Inventors: Hoon Choi, Gyeonggi-do (KR); Kwang-Jin Na, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 316 days.

(21) Appl. No.: 12/645,970

(22) Filed: Dec. 23, 2009

(65) Prior Publication Data
US 2011/0095797 A1   Apr. 28, 2011

(30) Foreign Application Priority Data
Oct. 26, 2009   (KR) .................. 10-2009-0101950

(51) Int. Cl.
*H03K 3/16* (2006.01)
*H03K 3/30* (2006.01)
(52) U.S. Cl. ............................. 327/191; 327/199
(58) Field of Classification Search .................. 327/191, 327/199–202
See application file for complete search history.

(56) References Cited

U.S. PATENT DOCUMENTS
6,107,852 A * 8/2000 Durham et al. ............... 327/203
6,445,235 B1 * 9/2002 Sachdev ........................ 327/202

FOREIGN PATENT DOCUMENTS
JP   2003-067077      3/2003
KR  1020020048444    6/2002
KR  1020040026649    3/2004
KR  1020040043835    5/2004
KR  1020040090842   10/2004

OTHER PUBLICATIONS

Notice of Preliminary Rejection issued from Korean Intellectual Property Office on Mar. 25, 2011.
Notice of Allowance issued by the Korean Intellectual Property Office on Jan. 9, 2012.
Office Action issued by the Korean Intellectual Property Office on Feb. 28, 2012.

* cited by examiner

*Primary Examiner* — Lincoln Donovan
*Assistant Examiner* — Diana J Cheng
(74) *Attorney, Agent, or Firm* — IP & T Group LLP

(57) ABSTRACT

A semiconductor device includes a clock delay section configured to receive an external clock signal, reflect different delay amounts on the external clock signal, and generate a plurality of synchronization clock signals, a clock synchronization section configured to synchronize a clock enable signal with each of the plurality of synchronization clock signals in an order beginning with a synchronization clock signal, on which a largest delay amount is reflected, to a synchronization clock signal, on which a smallest delay amount is reflected, and to generate a synchronized clock enable signal, and an internal clock generation section configured to generate an internal clock signal corresponding to the external clock signal, and to be on/off controlled in its operation in response to the synchronized clock enable signal.

16 Claims, 4 Drawing Sheets

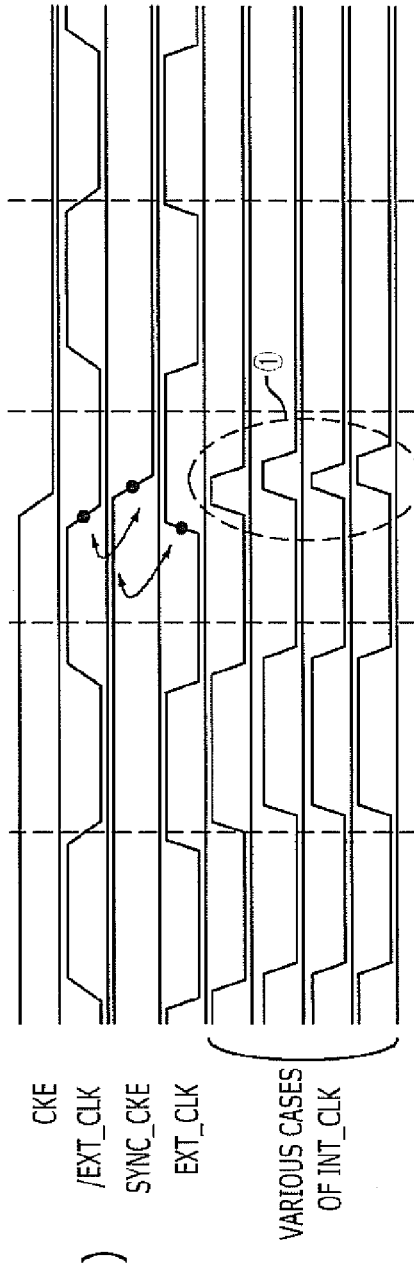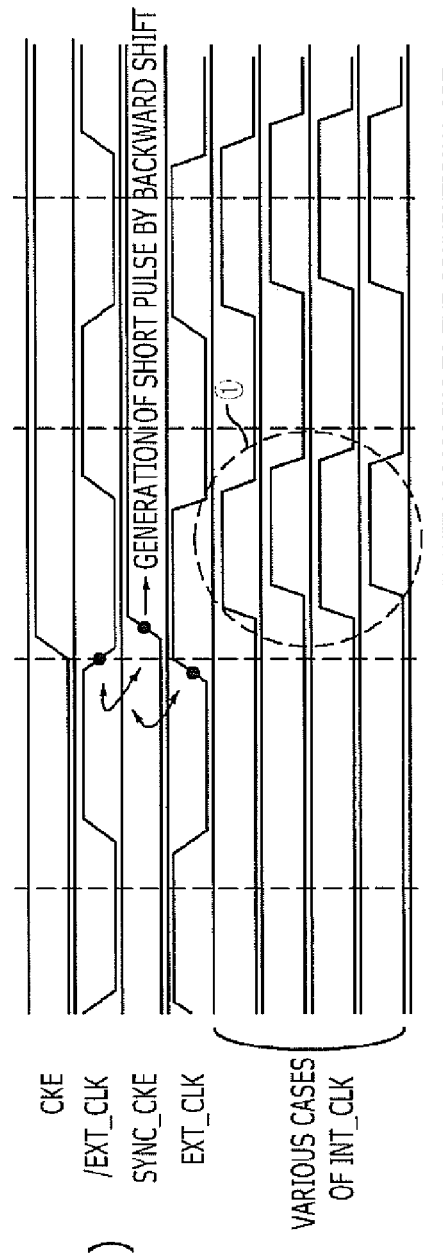
FIG. 3 (PRIOR ART)
FIG. 4 (PRIOR ART)

SEMICONDUCTOR DEVICE AND METHOD FOR OPERATING THE SAME

CROSS-REFERENCE TO RELATED APPLICATION

The present application claims priority of Korean Patent Application No. 10-2009-0101950, filed on Oct. 26, 2009, which is incorporated herein by reference in its entirety.

BACKGROUND OF THE INVENTION

Exemplary embodiments of the present invention relate to a semiconductor device, and more particularly, to a circuit which generates an internal clock signal by buffering an external clock signal.

In general, in a synchronous semiconductor device, such as a synchronous DRAM (SDRAM), an internal clock signal is generated by buffering an external clock signal, and a predetermined operation is performed using the generated internal clock signal.

At this time, in a procedure of generating the internal clock signal by buffering the external clock signal, the buffering operation should be able to be on/off controlled depending upon a clock enable signal. This is because most semiconductor devices support an operation mode for generating an internal clock signal in correspondence to an external clock signal, for example, a power down mode, in order to reduce current consumption.

FIG. 1 is a circuit diagram illustrating in detail a conventional circuit for generating an internal clock signal by buffering an external clock signal.

Referring to FIG. 1, a conventional circuit for generating an internal clock signal by buffering an external clock signal includes a synchronization section 100 which is configured to synchronize a clock enable signal CKE in response to an external clock signal EXT_CLK, and an internal clock generation section 120 which is configured to generate an internal clock signal INT_CLK corresponding to the external clock signal EXT_CLK and is on/off controlled in its operation in response to a synchronized clock enable signal SYNC_CKE that is outputted from the synchronization section 100.

The synchronization section 100 includes a pass gate PG and an inverter INV1. The pass gate PG is configured to receive the external clock signal EXT_CLK through a negative input terminal and a clock signal /EXT_CLK obtained by inverting the phase of the external clock signal EXT_CLK through a positive input terminal. Further, the pass gate PG is configured to control the transmission of the clock enable signal CKE applied through a signal input terminal to a signal output terminal as the synchronized clock enable signal SYNC_CKE.

The internal clock generation section 120 includes a NAND gate NAND and an inverter INV2. The NAND gate NAND is configured to receive the external clock signal EXT_CLK through a first input terminal and the synchronized clock enable signal SYNC_CKE outputted from the synchronization section 100 through a second input terminal, to execute a NAND operation, and to output the internal clock signal INT_CLK.

FIG. 2 is a timing diagram illustrating the operation of the conventional circuit for generating an internal clock signal by buffering an external clock signal shown in FIG. 1.

Referring to FIG. 2, it is to be understood that the external clock signal EXT_CLK toggles with a period, while the clock enable signal CKE momentarily transits from an inactivated state of a logic low level to an activated state of a logic high level.

In this regard, if the time at which the clock enable signal CKE transits from the logic low level to the logic high level is close to an edge of the external clock signal EXT_CLK (i.e., either a falling edge or a rising edge), concerns arise about glitches that may occur in the synchronized clock enable signal SYNC_CKE outputted from the synchronization section 100, as shown in FIG. 2.

In the case where the internal clock generation section 120 is operated using the synchronized clock enable signal SYNC_CKE as shown, in which the glitches occur, the internal clock signal INT_CLK cannot be properly generated. In other words, where the synchronized clock enable signal SYNC_CKE has glitches, the internal clock signal INT_CLK is generated with glitches occurring therein as shown in FIG. 2.

As the frequency of the external clock signal EXT_CLK becomes high, these glitches may markedly influence the operation of an entire semiconductor device.

FIG. 3 is a timing diagram illustrating an operation of the conventional clock buffering circuit shown in FIG. 1.

FIG. 3 shows the buffering operations in a case in which the clock enable signal CKE transits from an activated state of a logic high level to an inactivated state of a logic low level.

As shown in FIG. 3, if the clock enable signal CKE transits from an activated state of a logic high level to an inactivated state of a logic low level (i.e., at a falling edge) at substantially the same time in which the external clock signal EXT_CLK transits from an inactivated state of a logic low level to an activated state of a logic high level (i.e., at a rising edge), a concern arises regarding the generation of the internal clock signal INT_SIGNAL. As identified by the circled number ①  in the drawing, the generated internal clock signal INT_CLK cannot have a precise logic level due to a glitch which occurs in the course of generating the synchronized clock enable signal SYNC_CKE by synchronizing the clock enable signal CKE with the clock signal /EXT_CLK obtained by inverting the phase of the external clock signal EXT_CLK, and a glitch which occurs in the course of generating the internal clock signal INT_CLK by executing the NAND operation between the synchronized clock enable signal SYNC_CKE and the external clock signal EXT_CLK.

More specifically, due to the occurrence of the glitches, the time at which the synchronized clock enable signal SYNC_CKE transits from an activated state of a logic high level to an inactivated state of a logic low level (i.e., at the time of a falling edge) lags the time at which the external clock signal EXT_CLK transits from an inactivated state of a logic low level to an activated state of a logic high level (i.e., at the time of a rising edge), by an amount of time that cannot be known in advance. Due to this fact, after the internal clock signal INT_CLK transits from an inactivated state of a logic low level to an activated state of a logic high level in correspondence with the external clock signal EXT_CLK, the internal clock signal INT_CLK transits from an activated state of a logic high level to an inactivated state of a logic low level. Thus, the internal clock signal INT_CLK cannot maintain a normal toggling interval.

In this way, in the conventional clock buffering circuit, if the time at which the logic level of the external clock signal EXT_CLK transits and the time at which the clock enable signal CKE toggles are close to each other, a pulse may be generated such that the internal clock signal INT_CLK cannot be recognized as a normal clock signal, and due to this fact, an entire semiconductor device may malfunction.

FIG. 4 is a timing diagram illustrating another operation of the conventional clock buffering circuit shown in FIG. 1.

FIG. 4 shows the buffering operations in a case in which the clock enable signal CKE transits from an inactivated state of a logic low level to an activated state of a logic high level.

As shown in FIG. 4, if the clock enable signal CKE transits from an inactivated state of a logic low level to an activated state of a logic high level (i.e. at a rising edge) at substantially the same time in which the external clock signal EXT_CLK transits from an inactivated state of a logic low level to an activated state of a logic high level (i.e., at a rising edge), a concern arises regarding the generation of the internal clock signal INT SIGNAL. As identified by the circled number ① in the drawing, the generated internal clock signal INT_CLK cannot have a normal activation interval due to a glitch which occurs in the course of generating the synchronized clock enable signal SYNC_CKE by synchronizing the clock enable signal CKE with the clock signal /EXT_CLK obtained by inverting the phase of the external clock signal EXT_CLK, and a glitch which occurs in the course of generating the internal clock signal INT_CLK by executing the NAND operation between the synchronized clock enable signal SYNC_CKE and the external clock signal EXT_CLK.

More specifically, due to the occurrence of the glitches, the time at which the synchronized clock enable signal SYNC_CKE transits from an inactivated state of a logic low level to an activated state of a logic high level (i.e., at the time of a rising edge) lags the time at which the external clock signal EXT_CLK transits from an inactivated state of a logic low level to an activated state of a logic high level (i.e., at the time of a rising edge), by an amount of time that cannot be known in advance. Due to this fact, the time at which the internal clock signal INT_CLK transits from an inactivated state of a logic low level to an activated state of a logic high level, in correspondence with the external clock signal EXT_CLK, is shifted backward. Thus, the internal clock signal INT_CLK cannot maintain a normal toggling interval.

In this way, in the conventional clock buffering circuit, if the time at which the logic level of the external clock signal EXT_CLK transits and the time at which the clock enable signal CKE toggles are close to each other, a pulse can be generated such that the internal clock signal INT_CLK cannot be recognized as a normal clock signal, and due to this fact, an entire semiconductor device may malfunction.

SUMMARY OF THE INVENTION

An embodiment of the present invention is directed to a clock buffering circuit of a semiconductor device which, when generating an internal clock signal by buffering an external clock signal, can prevent glitches from occurring in a procedure of on/off controlling a buffering operation, using a clock enable signal asynchronous from the external clock signal.

In accordance with an embodiment of the present invention, a semiconductor device includes a clock delay section configured to receive an external clock signal, reflect different delay amounts on the external clock signal, and generate a plurality of synchronization clock signals, a clock synchronization section configured to synchronize a clock enable signal with each of the plurality of synchronization clock signals in an order beginning with a synchronization clock signal, on which a largest delay amount is reflected, to a synchronization clock signal, on which a smallest delay amount is reflected, and to generate a synchronized clock enable signal, and an internal clock generation section configured to generate an internal clock signal corresponding to the external clock signal, and to be on/off controlled in its operation in response to the synchronized clock enable signal.

In accordance with another embodiment of the present invention, a method for operating a semiconductor device includes generating a first synchronization clock signal that toggles at a time delayed by a first interval in comparison with toggling of an external clock signal, generating a second synchronization clock signal that toggles at a time delayed by a second interval greater than the first interval in comparison with the toggling of the external clock signal, generating a first synchronized clock enable signal by synchronizing a clock enable signal with the second synchronization clock signal, generating a second synchronized clock enable signal by synchronizing the first synchronized clock enable signal with the first synchronization clock signal, and generating an internal clock signal corresponding to the external clock signal by performing an on/off controlling operation in response to the second synchronized clock enable signal.

In accordance with yet another embodiment of the present invention, a semiconductor device includes a clock buffering block configured to receive an external clock signal, to buffer the external clock signal, to output an internal clock signal, and to be on/off controlled in its operation in response to a clock enable signal, a delay replication model block configured to reflect a delay time of an actual output path on the internal clock signal, and output a delay replication clock signal, and a delay locking block configured to compare phases of the internal clock signal and the delay replication clock signal, delay the internal clock signal by a time corresponding to a comparison result, and output a delay locked clock signal.

Furthermore, the clock buffering block includes a clock delay section configured to receive the external clock signal, reflect different delay amounts on the external clock signal, and generate a plurality of synchronization clock signals, a clock synchronization section configured to synchronize the clock enable signal with each of the plurality of synchronization clock signals in an order beginning with a synchronization clock signal, on which a largest delay amount is reflected, to a synchronization clock signal, on which a smallest delay amount is reflected, and to generate a synchronized clock enable signal, and an internal clock generation section configured to generate the internal clock signal corresponding to the external clock signal, and to be on/off controlled in its operation in response to the synchronized clock enable signal.

BRIEF DESCRIPTION OF THE DRAWINGS

FIG. 3 is a timing diagram illustrating an operation of the conventional clock buffering circuit shown in FIG. 1.

FIG. 4 is a timing diagram illustrating another operation of the conventional clock buffering circuit shown in FIG. 1.

DESCRIPTION OF SPECIFIC EMBODIMENT

Figure 1:
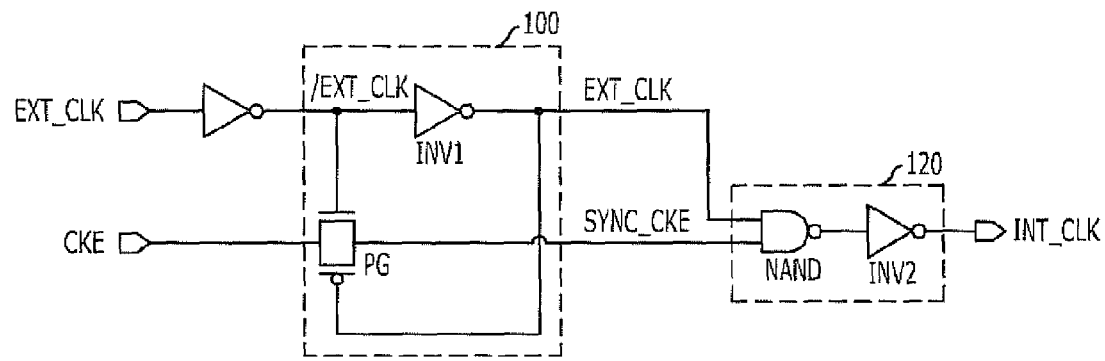
FIG. 1 is a circuit diagram illustrating in detail a conventional circuit for generating an internal clock signal by buffering an external clock signal.
Figure 2:
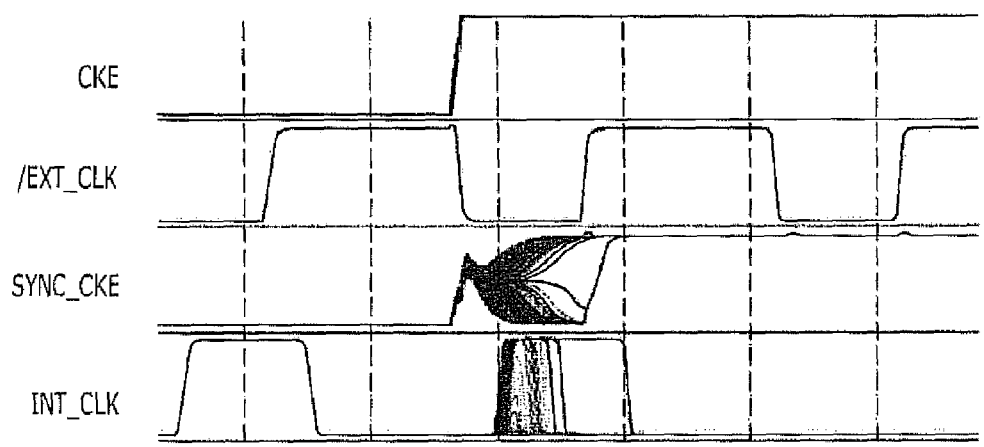
FIG. 2 is a timing diagram illustrating the operation of the conventional circuit for generating an internal clock signal by buffering an external clock signal shown in FIG. 1.

An exemplary embodiment of the present invention will be described below in more detail with reference to the accompanying drawings. The present invention may, however, be embodied in different forms and should not be construed as limited to the embodiment set forth herein. Rather, the embodiment is provided so that this application will be thorough and complete, and will fully convey the scope of the present invention to those skilled in the art. Throughout the application, like reference numerals refer to like parts throughout the various figures and embodiment of the present invention.

Figure 5:
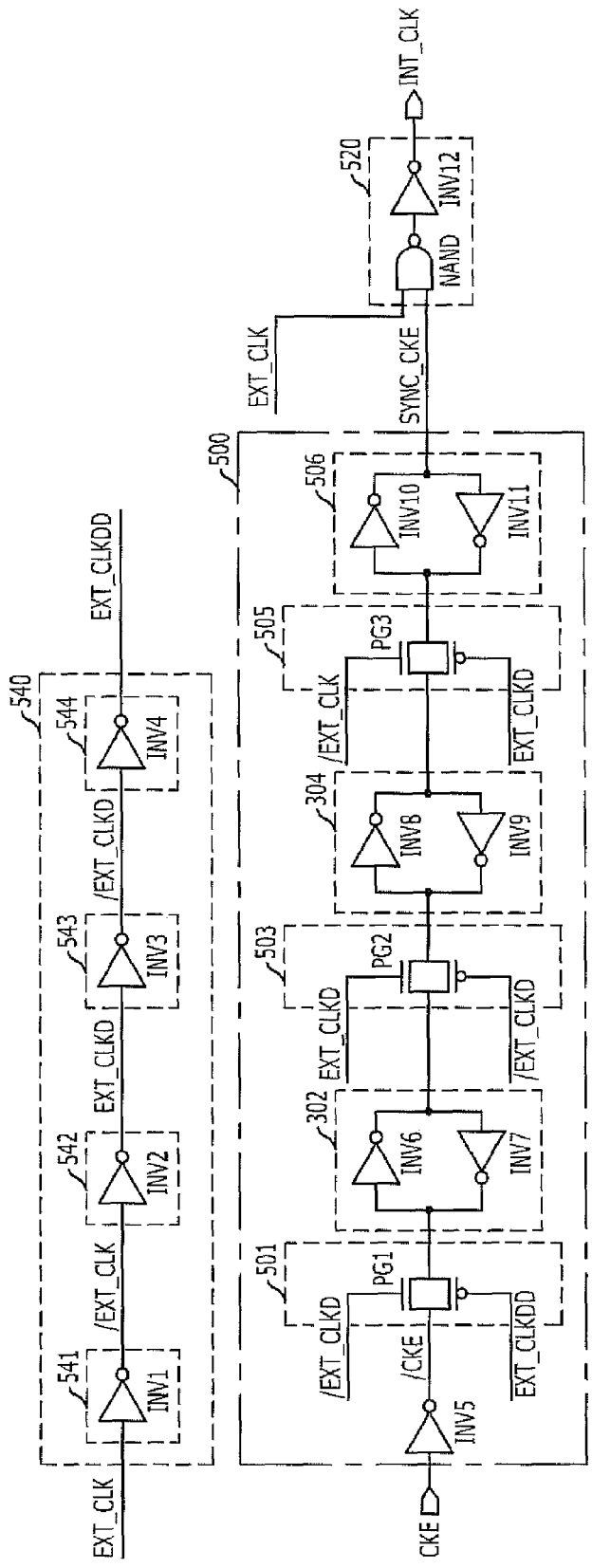
FIG. 5 is a circuit diagram illustrating a circuit for generating an internal clock signal by buffering an external clock signal in accordance with an embodiment of the present invention.

FIG. 5 is a circuit diagram illustrating a circuit for generating an internal clock signal by buffering an external clock signal in accordance with an embodiment of the present invention.

Referring to FIG. 5, a circuit for generating an internal clock signal by buffering an external clock signal in accordance with an embodiment of the present invention includes a clock delay section 540, a synchronization section 500, and an internal clock generation section 520. The clock delay section 540 is configured to receive an external clock signal EXT_CLK, reflect different delay amounts, and generate a plurality of synchronization clock signals /EXT_CLK, EXT_CLKD, /EXT_CLKD, and EXT_CLKDD. The synchronization section 500 is configured to synchronize a clock enable signal CKE with the synchronization clock signals /EXT_CLK, EXT_CLKD, /EXT_CLKD, and EXT_CLKDD, in an order beginning with the synchronization clock signal EXT_CLKDD, on which a largest delay amount is reflected, to the synchronization clock signal /EXT_CLK, on which a smallest delay amount is reflected. Further, the synchronization section 500 is configured to generate a synchronized clock enable signal SYNC_CKE. The internal clock generation section 520 is configured to generate an internal clock signal INT_CLK corresponding to the external clock signal EXT_CLK, and is on/off controlled in its operation in response to the synchronized clock enable signal SYNC_CKE.

The clock delay section 540 includes first delay units 541 and 542, second delay units 542 and 543, and third delay units 543 and 544. The first delay units 541 and 542 are configured to receive the external clock signal EXT_CLK, delay the external clock signal EXT_CLK by a first predetermined delay amount, and generate first synchronization clock signals /EXT_CLK and EXT_CLKD that are included in the plurality of synchronization clock signals /EXT_CLK, EXT_CLKD, /EXT_CLKD, and EXT_CLKDD. The second delay units 542 and 543 are configured to receive the first synchronization clock signals /EXT_CLK and EXT_CLKD, delay the first synchronization clock signals /EXT_CLK and EXT_CLKD by a second predetermined delay amount, and generate second synchronization clock signals EXT_CLKD and /EXT_CLKD that are included in the plurality of synchronization clock signals /EXT_CLK, EXT_CLKD, /EXT_CLKD and EXT_CLKDD. The third delay units 543 and 544 are configured to receive the second synchronization clock signals EXT_CLKD and /EXT_CLKD, delay the second synchronization clock signals EXT_CLKD and /EXT_CLKD by a third predetermined delay amount, and generate third synchronization clock signals /EXT_CLKD and EXT_CLKDD that are included in the plurality of synchronization clock signals /EXT_CLK, EXT_CLKD, /EXT_CLKD and EXT_CLKDD.

For reference, it is to be appreciated that inverters INV1 and INV2 overlap with each other in the first delay units 541 and 542, inverters INV2 and INV3 overlap with each other in the second delay units 542 and 543, and inverters INV3 and INV4 overlap with each other in the third delay units 543 and 544, and that all of the inverters INV1, INV2, INV3, and INV4 are provided in the clock delay section 540. Thus, in accordance with an embodiment of the present invention, a clock signal is delayed using a plurality of inverters INV1, INV2, INV3 and INV4 in the clock delay section 540. It can be envisaged that a circuit having a structure different from that shown in FIG. 5 can be configured in a manner such that component elements do not overlap.

That is to say, the clock delay section 540 shown in the drawing represents one embodiment, and it is to be noted that the circuit having a structure different from that shown in FIG. 5 falls under the scope of the present invention.

In detail, the component elements of the clock delay section 540 shown in the drawing can be divided as described below.

The clock delay section 540 includes a first inverter INV1, a second inverter INV2, a third inverter INV3, and a fourth inverter INV4. The first inverter INV1 is configured to receive the external clock signal EXT_CLK, invert the phase of the external clock signal EXT_CLK, and generate a first clock signal /EXT_CLK that is delayed by a predetermined delay amount in comparison with the external clock signal EXT_CLK. The second inverter INV2 is configured to receive the first clock signal /EXT_CLK, invert the phase of the first clock signal /EXT_CLK, and generate a second clock signal EXT_CLKD that is delayed by a predetermined delay amount in comparison with the first clock signal /EXT_CLK. The third inverter INV3 is configured to receive the second clock signal EXT_CLKD, invert the phase of the second clock signal EXT_CLKD, and generate a third clock signal /EXT_CLKD that is delayed by a predetermined delay amount in comparison with the second clock signal EXT_CLKD. The fourth inverter INV4 which is configured to receive the third clock signal /EXT_CLKD, invert the phase of the third clock signal /EXT_CLKD, and generate a fourth clock signal EXT_CLKDD that is delayed by a predetermined delay amount in comparison with the third clock signal /EXT_CLKD. In sum, the inverters INV1, INV2, INV3, and INV4 generate the plurality of synchronization clock signals /EXT_CLK, EXT_CLKD, /EXT_CLKD, and EXT_CLKDD.

In the clock delay section 540 shown in FIG. 5, a first delay amount for delaying the inputted clock signals EXT_CLK and /EXT_CLK in the first delay units 541 and 542 and outputting the clock signals /EXT_CLK and EXT_CLKD, a second delay amount for delaying the clock signals /EXT_CLK and EXT_CLKD inputted to the second delay units 542 and 543 and outputting the clock signals EXT_CLKD and /EXT_CLKD, and a third delay amount for delaying the clock signals EXT_CLKD and /EXT_CLKD inputted to the third delay units 43 and 544 and outputting the clock signals /EXT_CLKD and EXT_CLKDD are the same delay amount. That is to say, the first inverter INV1 through the fourth inverter INV4 have the same size, so that the clock signals inputted thereto can be outputted after being delayed by the same delay amount.

However, it is to be noted that, in a circuit having a structure different from that shown in the drawing, the first through third delay amounts can each be different delay amounts, or two of the first through third delay amounts can be the same delay amount while the remaining delay amount can be a different delay amount.

The clock synchronization section 500 includes a first synchronization unit 501, a second synchronization unit 503, and a third synchronization unit 505. The first synchronization unit 501 is configured to receive the clock enable signal CKE and synchronize the clock enable signal CKE with the third synchronization clock signals /EXT_CLKD and EXT_CLKDD. The second synchronization unit 503 is configured to receive an output signal of the first synchronization unit 501 and synchronize the output signal of the first synchronization unit 501 with the second synchronization clock signals EXT_CLKD and /EXT_CLKD. The third synchronization unit 505 is configured to receive an output signal of the second synchronization unit 503 and synchronize the output signal of the second synchronization unit 503 with the first synchronization clock signals /EXT_CLK and EXT_CLKD.

For reference, the clock synchronization section 500 shown in FIG. 5 includes not only a plurality of pass gates PG1, PG2, and PG3 for performing a clock synchronization operation, but also includes a plurality of inverters INV5, INV6, INV7, INV8, INV9, INV10, and INV11 for preventing the logic levels of the clock signals from floating. The reason why these pass gates PG1, PG2, and PG3 and inverters INV5, INV6, INV7, INV8, INV9, INV10, and INV11 are expressed as the first through third synchronization units 501, 503, and 505 is to provide a simplified explanation. The most important feature of the clock synchronization section 500, in accordance with the embodiment of the present invention, is that the inputted clock enable signal CKE is outputted by being synchronized with the plurality of synchronization clock signals /EXT_CLK, EXT_CLKD, /EXT_CLKD and EXT_CLKDD in an order beginning with the synchronization clock signal, on which a largest delay amount is reflected, to the synchronization clock signal, on which a smallest delay amount is reflected (i.e., with the synchronization clock signals EXT_CLKDD, /EXT_CLKD, EXT_CLKD and /EXT_CLK in that order). The circuit shown in the drawing can be described in detail as follows.

The clock synchronization section 500 includes a first pass gate PG1, a second pass gate PG2, and a third pass gate PG3. The first pass gate PG1 is configured to control the transmission of the phase-inverted clock enable signal /CKE applied through a signal input terminal to a signal output terminal, in response to the third synchronization clock signal /EXT_CLKD inputted through a positive input terminal and the fourth synchronization clock signal EXT_CLKDD inputted through a negative input terminal. The second pass gate PG2 is configured to control the transmission of an output signal of the first pass gate PG1 applied through a signal input terminal to a signal output terminal, in response to the second synchronization clock signal EXT_CLKD inputted through a positive input terminal and the third synchronization clock signal /EXT_CLKD inputted through a negative input terminal. The third pass gate PG3 is configured to control the transmission of an output signal of the second pass gate PG2 applied through a signal input terminal to a signal output terminal, in response to the first synchronization clock signal /EXT_CLK inputted through a positive input terminal and the second synchronization clock signal EXT_CLKD inputted through a negative input terminal.

The clock synchronization section 500 further includes a first latch 502, a second latch 504, and a third latch 506 which are respectively connected to signal output terminals of the first pass gate PG1, the second pass gate PG2, and the third pass gate PG3, and prevent output signals from floating.

The internal clock generation section 520 is configured to toggle the internal clock signal INT_CLK in correspondence with toggling of the external clock signal EXT_CLK during an activation interval of the synchronized clock enable signal SYNC_CKE, and lock the internal clock signal INT_CLK to a predetermined logic level irrespective of toggling of the external clock signal EXT_CLK during an inactivation interval of the synchronized clock enable signal SYNC_CKE.

To this end, the internal clock generation section 520 includes a NAND gate NAND and an inverter INV12. The NAND gate NAND is configured to execute a NAND operation between the synchronized clock enable signal SYNC_CKE loaded to the signal output terminal of the third pass gate PG3 and the external clock signal EXT_CLK, and generate the internal clock signal INT_CLK.

Figure 6:
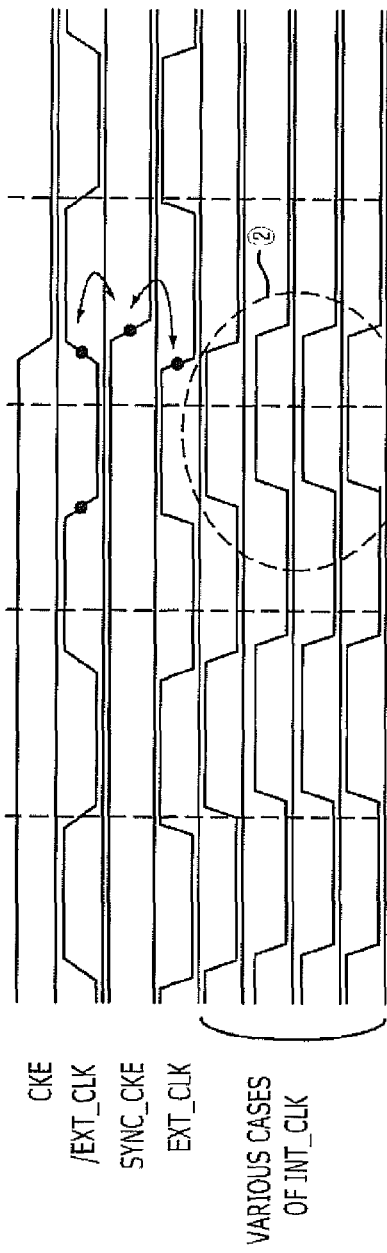
FIG. 6 is a timing diagram illustrating an operation of the clock buffering circuit in accordance with the embodiment of the present invention shown in FIG. 5.

FIG. 6 is a timing diagram illustrating an operation of the clock buffering circuit in accordance with the embodiment of the present invention shown in FIG. 5.

As shown in FIG. 6, even if the clock enable signal CKE transits from an activated state of a logic high level to an inactivated state of a logic low level (i.e., at a falling edge) at substantially the same time in which the external clock signal EXT_CLK transits from an activated state of a logic high level to an inactivated state of a logic low level (i.e., at a falling edge), a glitch does not substantially occur in the course of generating the synchronized clock enable signal SYNC_CKE by synchronizing the clock enable signal CKE with the plurality of synchronization clock signals /EXT_CLK, EXT_CLKD, /EXT_CLKD, and EXT_CLKDD.

Furthermore, in the embodiment of the present invention, the synchronized clock enable signal SYNC_CKE is generated by synchronizing the clock enable signal CKE with the plurality of synchronization clock signals /EXT_CLK, EXT_CLKD, /EXT_CLKD, and EXT_CLKDD in an order beginning with the synchronization clock signal, on which a largest delay amount is reflected, to the synchronization clock signal, on which a smallest delay amount is reflected (i.e., with the synchronization clock signals EXT_CLKDD, /EXT_ CLKD, EXT_CLKD and /EXT_CLK in that order). Therefore, always after the operation in which the clock signal /EXT_CLK, obtained by inverting the phase of the external clock signal EXT_CLK, transits from an inactivated state of a logic low level to an activated state of a logic high level is performed, the operation in which the synchronized clock enable signal SYNC_CKE transits from an activated state of a logic high level to an inactivated state of a logic low level is performed. Due to this fact, it is to be understood that, in the course of generating the internal clock signal INT_CLK by executing a NAND operation between the external clock signal EXT_CLK and the synchronized clock enable signal SYNC_CKE, the internal clock signal INT_CLK can always have a precise logic level as shown by the circled number ② in the drawing.

In other words, in the clock buffering circuit in accordance with the embodiment of the present invention, because the synchronized clock enable signal SYNC_CKE transits from an activated state of a logic high level to an inactivated state of a logic low level always after the external clock signal EXT_CLK transits from an activated state of a logic high level to an inactivated state of a logic low level, the internal clock signal INT_CLK generated in correspondence with the external clock signal EXT_CLK can always have a normal toggling interval.

In this way, in the clock buffering circuit in accordance with the embodiment of the present invention, even when the time at which the logic level of the external clock signal EXT_CLK changes and the time at which the clock enable signal CKE toggles are close to each other, the internal clock signal INT_CLK can always have a normal toggling interval, and due to this fact, it is possible to prevent a semiconductor device from malfunctioning.

Figure 7:
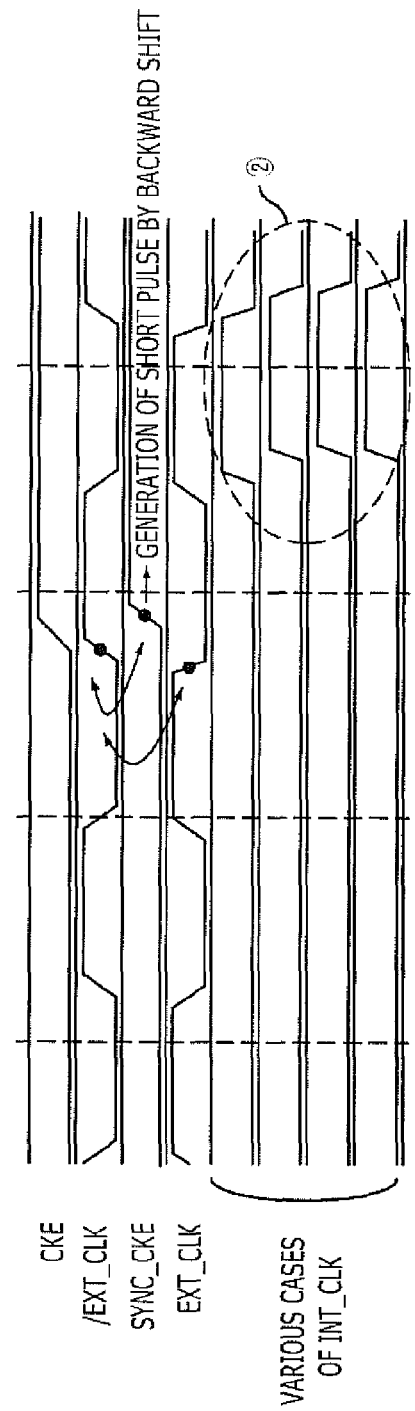
FIG. 7 is a timing diagram illustrating another operation of the clock buffering circuit in accordance with the embodiment of the present invention shown in FIG. 5.

FIG. 7 is a timing diagram illustrating another operation of the clock buffering circuit in accordance with the embodiment of the present invention shown in FIG. 5.

As shown in FIG. 7, in the embodiment of the present invention, the synchronized clock enable signal SYNC_CKE is generated by synchronizing the clock enable signal CKE with the plurality of synchronization clock signals /EXT_CLK, EXT_CLKD, /EXT_CLKD, and EXT_CLKDD in an order beginning with the synchronization clock signal, on which a largest delay amount is reflected, to the synchronization clock signal, on which a smallest delay amount is reflected, (i.e., with the synchronization clock signals EXT_CLKDD, /EXT_CLKD, EXT_CLKD and /EXT_CLK in that order). Therefore, always after the operation in which the clock signal /EXT_CLK obtained by inverting the phase of the external clock signal EXT_CLK transits from an inactivated state of a logic low level to an activated state of a logic high level is performed, the operation in which the synchronized clock enable signal SYNC_CKE transits from an inactivated state of a logic low level to an activated state of a logic high level is performed. Due to this fact, it is to be understood that, in the course of generating the internal clock signal INT_CLK by executing a NAND operation between the external clock signal EXT_CLK and the synchronized clock enable signal SYNC_CKE, the internal clock signal INT_CLK can always have a precise logic level as shown by the circled number ② in the drawing.

In other words, in the clock buffering circuit in accordance with the embodiment of the present invention, because the synchronized clock enable signal SYNC_CKE transits from an inactivated state of a logic low level to an activated state of a logic high level always after the external clock signal EXT_CLK transits from an activated state of a logic high level to an inactivated state of a logic low level, the internal clock signal INT_CLK generated in correspondence with the external clock signal EXT_CLK can always have a normal toggling interval.

In this way, in the clock buffering circuit in accordance with the embodiment of the present invention, even when the time at which the logic level of the external clock signal EXT_CLK changes and the time at which the clock enable signal CKE toggles are close to each other, the internal clock signal INT_CLK can always have a normal toggling interval, and due to this fact, it is possible to prevent a semiconductor device from malfunctioning.

As described above, in the embodiment of the present invention, when generating the internal clock signal INT_CLK by buffering the external clock signal EXT_CLK, in the course of on/off controlling the buffering operation using the clock enable signal CKE that is asynchronous from the external clock signal EXT_CLK, the clock enable signal CKE is synchronized with the plurality of synchronization clock signals /EXT_CLK, EXT_CLKD, /EXT_CLKD, and EXT_CLKDD that are obtained by stepwise delaying the external clock signal EXT_CLK, in a preset order from the synchronization clock signal, on which a largest delay amount is reflected, to the synchronization clock signal, on which a smallest delay amount is reflected (i.e., with the synchronization clock signals EXT_CLKDD, /EXT_CLKD, EXT_CLKD and /EXT_CLK in that order), whereby it is possible to prevent glitches from occurring. As a consequence, it is possible to generate the internal clock signal INT_CLK that has a toggling interval precisely corresponding to the toggling interval of the external clock signal EXT_CLK irrespective of the time at which the logic level of the clock enable signal CKE changes.

For reference, the clock buffering circuit in accordance with the aforementioned embodiment of the present invention can be applied not only to a circuit for controlling generation of an internal clock signal by buffering an external clock signal, but also to an element for controlling introduction to a power down mode in a delay locked loop circuit.

Namely, the clock buffering circuit in accordance with the aforementioned embodiment of the present invention can be applied to any circuit which controls transmission of a clock signal toggling with a certain period in response to a control signal that is not synchronized with the period of the clock signal.

As is apparent from the above description, the present invention provides advantages in that, when generating an internal clock signal by buffering an external clock signal, a clock enable signal is synchronized, in an order established in advance, with a plurality of respective synchronized clock signals which are obtained by stepwise delaying the external clock signals in a procedure of on/off controlling the buffering operation, using a clock enable signal asynchronized with the external clock signal, whereby it is possible to prevent glitches from occurring.

While the present invention has been described with respect to the specific embodiment, it will be apparent to those skilled in the art that various changes and modifications may be made without departing from the spirit and scope of the invention as defined in the following claims.

For example, it should be realized that the logic gates and transistors exemplified in the above-described embodiment may have different positions and kinds depending upon the polarities of the signals inputted thereto.

What is claimed is:

1. A semiconductor device comprising:
   a clock delay section configured to receive an external clock signal, reflect different delay amounts on the external clock signal, and generate a plurality of synchronization clock signals;
   a clock synchronization section configured to synchronize a clock enable signal with each of the plurality of synchronization clock signals in an order beginning with a synchronization clock signal, on which a largest delay amount is reflected, to a synchronization clock signal, on which a smallest delay amount is reflected, and to generate a synchronized clock enable signal; and
   an internal clock generation section configured to generate an internal clock signal corresponding to the external clock signal, and to be on/off controlled in its operation in response to the synchronized clock enable signal.

2. The semiconductor device of claim 1, wherein the clock delay section comprises:
   first delay units configured to receive the external clock signal, delay the external clock signal by a first predetermined delay amount, and generate first synchronization clock signals that are included in the plurality of synchronization clock signals;
   second delay units configured to receive the first synchronization clock signals, delay the first synchronization clock signals by a second predetermined delay amount, and generate second synchronization clock signals that are included in the plurality of synchronization clock signals; and
   third delay units configured to receive the second synchronization clock signals, delay the second synchronization clock signals by a third predetermined delay amount, and generate third synchronization clock signals that are included in the plurality of synchronization clock signals.

3. The semiconductor device of claim 2, wherein the first delay amount, the second delay amount, and the third delay amount are the same delay amount.

4. The semiconductor device of claim 2, wherein at least one of the first delay amount, the second delay amount, and the third delay amount is a different delay amount.

5. The semiconductor device of claim 2, wherein the clock synchronization section comprises:
a first synchronization unit configured to receive the clock enable signal and synchronize the clock enable signal with the third synchronization clock signals;
a second synchronization unit configured to receive an output signal of the first synchronization unit and synchronize the output signal of the first synchronization unit with the second synchronization clock signals; and
a third synchronization unit configured to receive an output signal of the second synchronization unit and synchronize the output signal of the second synchronization unit with the first synchronization clock signals.

6. The semiconductor device of claim 1, wherein the internal clock generation section is configured to toggle the internal clock signal in correspondence with toggling of the external clock signal during an activation interval of the synchronized clock enable signal, and to lock the internal clock signal to a predetermined logic level irrespective of toggling of the external clock signal during an inactivation interval of the synchronized clock enable signal.

7. The semiconductor device of claim 1, wherein the clock delay section comprises:
a first inverter configured to receive the external clock signal, invert a phase of the external clock signal, and generate a first clock signal that is delayed by a predetermined delay amount in comparison with the external clock signal and is included in the plurality of synchronization clock signals;
a second inverter configured to receive the first clock signal, invert a phase of the first clock signal, and generate a second clock signal that is delayed by a predetermined delay amount in comparison with the first clock signal and is included in the plurality of synchronization clock signals;
a third inverter configured to receive the second clock signal, invert a phase of the second clock signal, and generate a third clock signal that is delayed by a predetermined delay amount in comparison with the second clock signal and is included in the plurality of synchronization clock signals; and
a fourth inverter configured to receive the third clock signal, invert a phase of the third clock signal, and generate a fourth clock signal that is delayed by a predetermined delay amount in comparison with the third clock signal and is included in the plurality of synchronization clock signals.

8. The semiconductor device of claim 7, wherein the clock synchronization section comprises:
a first pass gate configured to control transmission of the clock enable signal applied through a signal input terminal to a signal output terminal, in response to the third clock signal inputted through a positive input terminal and the fourth clock signal inputted through a negative input terminal;
a second pass gate configured to control transmission of an output signal of the first pass gate applied through a signal input terminal to a signal output terminal, in response to the second clock signal inputted through a positive input terminal and the third clock signal inputted through a negative input terminal; and
a third pass gate configured to control transmission of an output signal of the second pass gate applied through a signal input terminal to a signal output terminal, in response to the first clock signal inputted through a positive input terminal and the second clock signal inputted through a negative input terminal.

9. The semiconductor device of claim 8, wherein the clock synchronization section further comprises:
first, second, and third latches respectively connected to signal output terminals of the first, second, and third pass gates and configured to prevent output signals at the signal output terminals from floating.

10. The semiconductor device of claim 9, wherein the internal clock generation section is configured to execute a NAND operation between the synchronized clock enable signal loaded to the signal output terminal of the third pass gate and the external clock signal, and to generate the internal clock signal.

11. A method for operating a semiconductor device, comprising:
generating a first synchronization clock signal that toggles at a time delayed by a first interval in comparison with toggling of an external clock signal;
generating a second synchronization clock signal that toggles at a time delayed by a second interval greater than the first interval in comparison with the toggling of the external clock signal;
generating a first synchronized clock enable signal by synchronizing a clock enable signal with the second synchronization clock signal;
generating a second synchronized clock enable signal by synchronizing the first synchronized clock enable signal with the first synchronization clock signal; and
generating an internal clock signal corresponding to the external clock signal by performing an on/off controlling operation in response to the second synchronized clock enable signal.

12. The method of claim 11, wherein the on/off controlling operation comprises:
toggling the internal clock signal in correspondence with the toggling of the external clock signal when the second synchronized clock enable signal is in an activated state; and
locking the internal clock signal to a predetermined logic level irrespective of the toggling of the external clock signal when the second synchronized clock enable signal is in an inactivated state.

13. A semiconductor device comprising:
a clock buffering block configured to receive an external clock signal, to buffer the external clock signal, to output an internal clock signal, and to be on/off controlled in its operation in response to a clock enable signal;
a delay replication model block configured to reflect a delay time of an actual output path on the internal clock signal, and output a delay replication clock signal; and
a delay locking block configured to compare phases of the internal clock signal and the delay replication clock signal, delay the internal clock signal by a time corresponding to a comparison result, and output a delay locked clock signal,
the clock buffering block, comprising
a clock delay section configured to receive the external clock signal, reflect different delay amounts on the external clock signal, and generate a plurality of synchronization clock signals;

a clock synchronization section configured to synchronize the clock enable signal with each of the plurality of synchronization clock signals in an order beginning with a synchronization clock signal, on which a largest delay amount is reflected, to a synchronization clock signal, on which a smallest delay amount is reflected, and to generate a synchronized clock enable signal; and an internal clock generation section configured to generate the internal clock signal corresponding to the external clock signal, and to be on/off controlled in its operation in response to the synchronized clock enable signal.

14. The semiconductor device of claim 13, wherein the clock delay section comprises:

first delay units configured to receive the external clock signal, delay the external clock signal by a first predetermined delay amount, and generate first synchronization clock signals that are included in the plurality of synchronization clock signals;

second delay units configured to receive the first synchronization clock signals, delay the first synchronization clock signals by a second predetermined delay amount, and generate second synchronization clock signals that are included in the plurality of synchronization clock signals; and third delay units configured to receive the second synchronization clock signals, delay the second synchronization clock signals by a third predetermined delay amount, and generate third synchronization clock signals that are included in the plurality of synchronization clock signals.

15. The semiconductor device of claim 14, wherein the clock synchronization section comprises:

a first synchronization unit configured to receive the clock enable signal and synchronize the clock enable signal with the third synchronization clock signals;

a second synchronization unit configured to receive an output signal of the first synchronization unit and synchronize the output signal of the first synchronization unit with the second synchronization clock signals; and a third synchronization unit configured to receive an output signal of the second synchronization unit and synchronize the output signal of the second synchronization unit with the first synchronization clock signals.

16. The semiconductor device of claim 13, wherein the internal clock generation section is configured to toggle the internal clock signal in correspondence with toggling of the external clock signal during an activation interval of the synchronized clock enable signal, and to lock the internal clock signal to a predetermined logic level irrespective of toggling of the external clock signal during an inactivation interval of the synchronized clock enable signal.

* * * * *